(12) United States Patent
Jung et al.

(10) Patent No.: US 7,510,979 B2
(45) Date of Patent: Mar. 31, 2009

(54) METHOD FOR FORMING A PATTERN ON A SEMICONDUCTOR DEVICE AND SEMICONDUCTOR DEVICE RESULTING FROM THE SAME

(75) Inventors: Jae-chang Jung, Seoul (KR); Keun Kyu Kong, Icheon-si (KR); Jin-soo Kim, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/770,503

(22) Filed: Jun. 28, 2007

(65) Prior Publication Data

US 2008/0020592 A1    Jan. 24, 2008

Related U.S. Application Data

(62) Division of application No. 10/963,129, filed on Oct. 12, 2004, now Pat. No. 7,285,370.

(30) Foreign Application Priority Data

Oct. 15, 2003    (KR) ............................... 2003-71916

(51) Int. Cl.
*H01L 21/302*    (2006.01)
*C08F 234/02*    (2006.01)
*G03F 7/00*    (2006.01)

(52) U.S. Cl. .................... 438/725; 526/266; 430/270.1
(58) Field of Classification Search ............. 430/270.1; 438/725, 790, 792; 526/266
See application file for complete search history.

(56) References Cited

U.S. PATENT DOCUMENTS

| 6,165,684 | A | 12/2000 | Mizutani et al. |
| 6,399,269 | B2 | 6/2002 | Mizutani et al. |
| 6,835,532 | B2 | 12/2004 | Jung |
| 7,033,729 | B2 | 4/2006 | Jung et al. |
| 7,160,668 | B2 | 1/2007 | Jung et al. |
| 2003/0148212 | A1* | 8/2003 | Lee et al. ................. 430/270.1 |

* cited by examiner

*Primary Examiner*—W. David Coleman
(74) *Attorney, Agent, or Firm*—Marshall, Gerstein & Borun LLP

(57) ABSTRACT

Disclosed are a light absorbent agent polymer for organic anti-reflective coating which can prevent diffused light reflection of bottom film layer or substrate and reduce standing waves caused by a variation of thickness of the photoresist itself, thereby, increasing uniformity of the photoresist pattern, in a process for forming ultra-fine patterns of photoresist for photolithography by using 193 nm ArF among processes for manufacturing semiconductor devices, and its preparation method. Also, the present invention discloses an organic anti-reflective coating composition comprising a light absorbent agent polymer for the organic anti-reflective coating and a pattern formation process using the coating composition.

5 Claims, 1 Drawing Sheet

METHOD FOR FORMING A PATTERN ON A SEMICONDUCTOR DEVICE AND SEMICONDUCTOR DEVICE RESULTING FROM THE SAME

CROSS-REFERENCE TO RELATED APPLICATIONS

This is a divisional of U.S. application Ser. No. 10/963,129 (the disclosure of which is incorporated herein by reference in its entirety), filed Oct. 12, 2004, which claims foreign priority from Korean Application No. KR 2003-071916, filed Oct. 15, 2003.

BACKGROUND OF THE INVENTION

1. Field of the Invention

The present invention relates to a light absorbent agent polymer useful for organic anti-reflective coatings which can prevent diffused light reflection of the bottom film layer or substrate and reduce standing waves caused by a variation of thickness of the photoresist itself, thereby, increasing uniformity of the photoresist pattern, in a process for forming ultrafine patterns of photoresist for photolithography by using 193 nm ArF among various processes for manufacturing semiconductor device, and its preparation method.

Also, the present invention provides an organic anti-reflective coating composition (hereinafter abbreviated as "the coating composition") comprising the light absorbent agent polymer for the organic anti-reflective coating (hereinafter abbreviated as "the coating polymers") and a pattern formation process using the coating composition.

2. Description of the Related Art

In a fabrication process of ultrafine patterns for preparing semiconductor devices, standing waves and reflective notching inevitably occur due to the optical properties of lower film layer on the photoresist film and due to the thickness changes in the photosensitive film. In addition, there is another problem in that a CD (critical dimension) alteration is caused by diffracted and reflected light from the lower film layers. Thus, it has been suggested to introduce anti-reflective coating that prevents back reflection of a lower film layer between a lower film and a photoresist by introducing organic material with high absorbance at a wavelength range of the light employed as a light source.

Especially, when exposed to UV light from the light source, a photoresist thin film is transmitted by the UV light, thus allowing the light absorbed in bottom portion of the thin film to be scattered and/or reflected. Such an anti-reflective coating can absorb the scattered and/or reflected light and, thereby, directly affecting the fine processing of the photoresist.

Anti-reflective coatings are classified into inorganic and organic anti-reflective coatings depending upon the material used, or as absorptive and interfering anti-reflective coatings based on the operation mechanism. For a fine pattern forming process using I-line (365 nm wavelength) radiation, inorganic anti-reflective coating are predominantly used, while TiN and amorphous carbon (a-C) are employed as an absorptive system anti-reflective coating and SiON are employed as an interfering system anti-reflective coating. In a fabrication process of ultrafine patterns using KrF light (248 nm), an inorganic anti-reflective coating has been mainly used and an organic anti-reflective coating has been used occasionally along with the inorganic anti-reflective coating.

However, in an ultra-fine pattern forming process using ArF light (193 nm), no proper anti-reflective coating has been developed yet. Especially, in the case of an inorganic anti-reflective coating, no material has been known which enables the control of the interference at 193 nm, the wavelength of the light source. Thus, there has been great deal of efforts to employ an organic compound as an anti-reflective coating.

To be a good organic anti-reflective coating, the following conditions must be satisfied.

First, an anti-reflective coating must not be dissolved by a solvent of the photoresist in the process of laminating an anti-reflective coating and then coating photoresist on the top portion thereof. In order to achieve this goal, such an anti-reflective coating must be designed to form a cross-linked structure without producing any chemical by-product, in a process of lamination an anti-reflective coating by coating an anti-reflective coating composition and then performing a baking process.

Second, in order to prevent diffused light reflection from a bottom film layer, the coating must contain certain materials to absorb light at the wavelength range of the exposure light source.

Third, no flowing in and out by chemicals such as acid or amine occur from the anti-reflective coating. This is because when acid migrates from anti-reflective coating to a photoresist film of an unexposed portion, undercutting occurs at a lower part of the pattern while footing may occur when a base, such as amine, migrates to the photoresist film. Such a phenomenon can be stopped by preventing such chemicals from coming in or going out of the anti-reflective coating.

Fourth, the etching speed of the anti-reflective coating should be faster than the etching speed of the upper photosensitive film so as to facilitate an etching process by using photosensitive film as a mask.

Finally, the anti-reflective coating must be as thin as possible to an extent as to sufficiently play a role as an anti-reflective coating.

In order to satisfy the above requirements, conventional organic anti-reflective coating compositions generally comprise a cross-linking agent to allow the anti-reflective coating to have a cross-linked structure, a light-absorbing agent to absorb the light at the wavelength range of exposure light source, a thermal acid generator as a catalyst for activating the cross-linking reaction, and an organic solvent.

As mentioned above, it strongly requires a novel organic anti-reflective coating preferably useable as the anti-reflective coating for the ArF light source at 193 nm, which can control the interference phenomenon to the ArF light source. Therefore, the present inventors have developed an anti-reflective coating polymer capable of controlling the interference phenomenon to the ArF light source, as well as to satisfy all of the requirements mentioned above, and a composition comprising the coating polymer, thereby accomplishing the present invention.

SUMMARY OF THE INVENTION

The present invention is designed in consideration of the problems of prior art mentioned above, and therefore it is an object of the present invention to provide a novel polymer useable as a light absorbent agent for an organic anti-reflective coating in an ultrafine pattern forming process by using an ArF light source with 193 nm wavelength in a semiconductor device production process, and its preparation method.

In another aspect, it is another object of the present invention to provide an organic anti-reflective coating composition comprising the organic anti-reflective coating polymer, a pattern forming method using the same and a semiconductor device produced by the pattern forming method.

To achieve the above objects, the present invention provides a light absorbent agent polymer for an organic anti-reflective coating represented by the following the general formula I and having a weight average molecular weight in the range of 5,000 to 15,000.

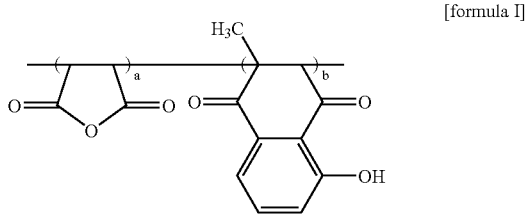

[formula I]

wherein a and b represent the mole percent of respective monomers and a:b=5 to 95% by mole: 5 to 95% by mole.

The polymer of formula I contains chromophore having a high absorbance at the wavelength of 193 nm, and comprises maleic anhydride as a monomer to sufficiently form a cross-linkage bond with a cross-linking polymer having an acetal functional group. Because of such characteristics, the polymer of formula I can be preferably used as the light absorbent agent in the organic anti-reflective coating composition with respect to the light source having 193 nm wavelength. That is, since the polymer of formula I is included in the coating composition for serving as the light absorbing agent, it can control the light interference phenomenon during the ultra-fine pattern formation process using the 193 nm light source. In addition, the polymer can easily form a cross-linkage bond with the cross-linking polymer to give solvent-resistant ability to the anti-reflective coating, thereby ensuring improved photoresist patterns by employing the coating composition containing such light absorbent agent to form the anti-reflective coating.

As mentioned above, the polymer of formula I has a molecular weight ranging from 5,000 to 15,000. If the molecular weight is less than 5,000, no sufficient cross-linkage bond will be generated on the formed anti-reflective coating and lead to the decrease in the solvent-resistance of the anti-reflective coating. If the molecular weight is higher than 15,000, the viscosity of the polymer becomes higher, thereby causing difficulty in producing the anti-reflective coating composition resulting in trouble with respect to the application of the anti-reflective coating composition.

The polymer of the formula I may be prepared by dissolving a maleic anhydride and 5-hydroxy-2-methyl-1,4-naphthoquinone in an organic solvent, adding a polymerization initiator to the dissolved material, then, conducting free-radical polymerization under vacuum conditions, at 60 to 70° C. for 6 to 12 hours.

The organic solvent for polymerization used in such preparation method preferably includes at least one selected from a group consisting of tetrahydrofuran, cyclohexanone, dimethyl formamide, dimethyl sulfoxide, dioxane, methylethylketone, PGMEA, ethylacetate, benzene, toluene and xylene. The polymerization initiator used in the above method includes all of conventional radical initiators for free-radical polymerization and, preferably, at least one selected from a group consisting of 2,2'-azobisisobutyronitrile (AIBN), benzoyl peroxide, acetyl peroxide, lauryl peroxide, t-butyl peracetate, t-butyl hydroperoxide and di-t-butyl peroxide.

In another aspect of the present invention, there is provided an organic anti-reflective coating composition comprising: a light absorbent agent polymer represented by the following formula I and having an average molecular weight in the range of 5,000 to 15,000; a cross-linking polymer represented by the following formula II and having a weight average molecular weight in the range of 2,000 to 70,000; a thermal acid generator; and an organic solvent.

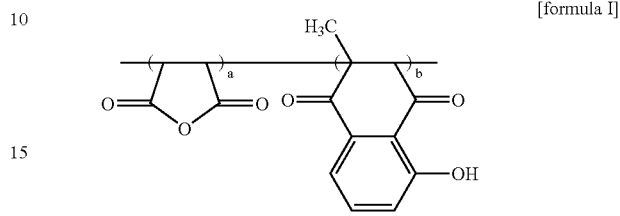

[formula I]

wherein a and b represent the mole percent of the respective monomers and a:b=5 to 95% by mole: 5 to 95% by mole.

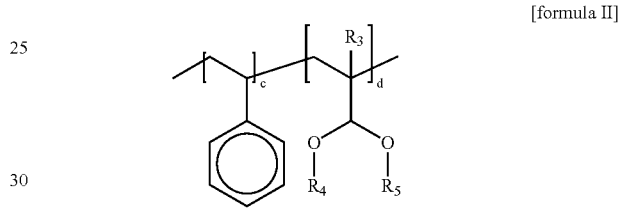

[formula II]

wherein $R_4$ and $R_5$ represent independent alkyl groups having 1 to 10 carbon atoms substituted by branched chain or main chain; $R_3$ is hydrogen or methyl group; and c:d=5 to 90% by mole: 10 to 95% by mole.

Briefly, the above coating composition of the present invention comprises the polymer represented by formula I as the light absorbent agent, in which the maleic anhydride group contained in the polymer of formula I can generate a cross-linkage bond with the acetal functional group contained in the cross-linking polymer of formula II, whereby the formed anti-reflective coating has sufficient solvent-resistance. Also, by such a cross-linkage bond, it is possible to protect chemical materials such as acid or amine from being transferred out of the anti-reflective coating, to, in turn, minimize under-cutting and/or a putting phenomenon resulting in formation of the improved photoresist pattern. Furthermore, both of the polymers represented by the formulae I and II comprise a chromophore having a remarkably high absorbance to absorb light reflected or diffused at bottom portion of the photoresist film and to significantly reduce the standing wave effect caused by such reflected and/or diffused light.

Such polymer of the formula II has been disclosed in Korean Patent Application No. 2002-73648 filed by the applicant of the present invention, which is enclosed herewith in reference to a practical procedure for producing the same and characteristics thereof.

In the organic anti-reflective coating composition according to the present invention, such cross-linking polymer of the formula II preferably comprises at least one selected from a group consisting of polymers having the structures of formulae III to VI.

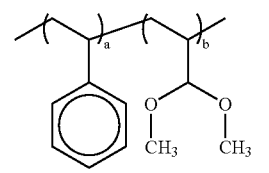

[formula III]

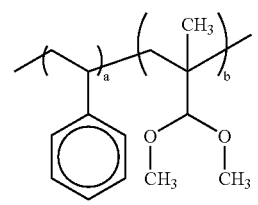

[formula IV]

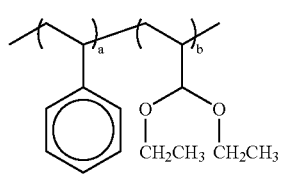

[formula V]

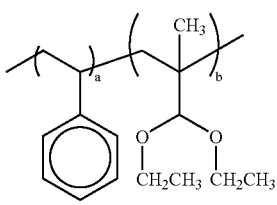

[formula VI]

wherein a:b=5 to 90% by mole: 10 to 95% by mole.

In particular, since the polymers of formulae III to VI can actively generate the cross-linkage bonds with the light absorbent agent polymer having a maleic anhydride group in the presence of acid, it can be preferably employed as a cross-linking agent in the organic anti-reflective coating composition according to the present invention.

With respect to the organic anti-reflective coating composition of the present invention, such thermal acid generator may be the one generally used in conventional organic anti-reflective coating compositions and, preferably comprises a compound having a structure represented by the following formula VII.

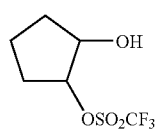

[formula VII]

The thermal acid generator serves as a catalyst for activating such cross-linking reaction between the above cross-linking agent and the light absorbent agent. When a thermal process such as the baking process is carried out after applying such thermal acid generator on a wafer, acid is generated from the thermal acid generator and, in the presence of acid generated by the above process, the cross-linking reaction brings out to form the organic anti-reflective coating insoluble in the solvent for the photoresist. In other words, it is possible to accelerate the cross-linking reaction between the light absorbent agent and the cross-linking agent by employing the compound in formula VII as the thermal acid generator.

The organic solvent used in the organic anti-reflective coating composition of the present invention preferably includes at least one selected from a group consisting of methyl 3-methoxy propionate (MMP), ethyl 3-ethoxy propionate (EEP), propyleneglycol methylether acetate (PGMEA) and cyclohexanone.

In the organic anti-reflective coating composition of the present invention, the amount of the polymer represented by formula I as the light absorbent agent is preferably in the range of 0.3 to 70% by weight with respect to the organic solvent contained in the anti-reflective coating composition and the amount of the polymer of formula II as the cross-linking agent is preferably in the range of 0.3 to 50% by weight with respect to the organic solvent contained in the anti-reflective coating composition. Likewise, the amount of the thermal acid generator is 0.5 to 40% by weight with respect to the total amount of the light absorbent agent and the cross-linking agent.

Therefore, when a baking process is carried out after applying the organic anti-reflective coating composition comprising such components mentioned above with the composition rates on the wafer, acid is generated from the thermal acid generator and, the cross-linking reaction brings out between the light absorbent agent polymer of formula I and the cross-linking agent polymer of formula II by the acid generated from the above process to form the organic anti-reflective coating. Such organic anti-reflective coating can absorb distant-ultraviolet (DUV) ray transmitting the photoresist film and reaching to the organic anti-reflective coating, thereby preventing diffused light reflection from the bottom layer of the photoresist film.

In this case, the organic anti-reflective coating becomes insoluble in the photoresist solution to be applied over the coating because of a cross-linkage bond formed between both of the polymers with the formulae I and II.

In a further aspect of the present invention, there is provided a method for forming pattern on a semiconductor device comprising the steps of: (a) coating the organic anti-reflective coating Composition of the present invention on top portion of a film layer to be etched; (b) conducting the baking process for the obtained material to generate the cross-linkage bond and form the resultant organic anti-reflective coating; (c) applying a photoresist on the top portion of the organic anti-reflective coating, exposing and developing the photoresist film to produce the desired photoresist pattern; (d) etching the organic anti-reflective coating by using the obtained photoresist pattern as an etching mask, in turn, the film layer to be etched, thereby forming a pattern on the film layer to be etched.

The patterning process of the present invention, the baking process is preferably performed at 15 to 250° C. for 1 to 5 minutes.

With respect to the patterning process of the present invention, the process may further comprise an additional baking process before or after the exposure process, which is preferably conducted at 70 to 200° C.

Although the anti-reflective coating composition and the patterning process according to the present invention are mostly adapted to an ultrafine pattern formation processes using an ArF light source, they can be also applied to other ultrafine pattern formation processes using KrF, DUV including EUV, E-beam, X-ray or an ionic beam.

In a still another aspect of the present invention, there is provided a semiconductor device produced by the patterning process according to the present invention mentioned above.

BRIEF DESCRIPTION OF THE DRAWINGS

Other objects and aspects of the present invention will become apparent from the following description of examples with reference to the accompanying drawing in which.

DESCRIPTION OF THE PREFERRED EMBODIMENT

EXAMPLES

Figure 1:
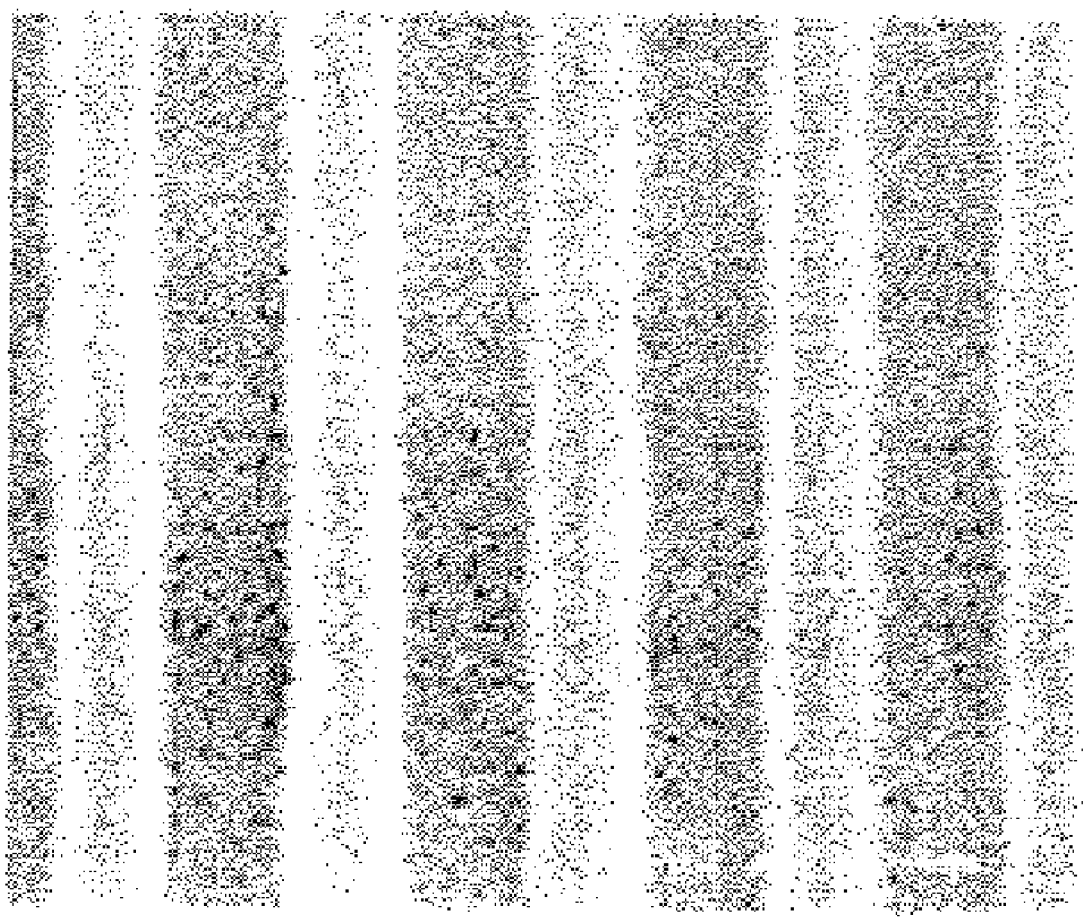
FIG. 1 is an electron microscopic photograph illustrating a pattern formed by a pattern formation process according to one example of the present invention.

The present invention is now described in a further detail with reference to examples, which are only illustrative and are not intended to limit the scope of the invention in any way.

Example 1

Synthesis of Light Absorbent Agent Polymer 20 g of maleic anhydride and 19 g of 5-hydroxy-2-methyl-1,4-naphthoquinone (0.5% by mole per maleic anhydride) were dissolved in 26 g of PGMEA. The dissolved mixture was added with 0.5 g of AIBN to form a vacuum condition then reacted at 65° C. for 7 hours. After completing the reaction, the solvent was removed from the obtained solution by means of an evaporator. Thereafter, the treated solution was under deposition and filtration processes in distilled water, then washed by using ethylether several times to produce the light absorbent agent polymer of formula I (yield 40%).

Molecular weight : 7,000

Example 2

Preparation of Organic Anti-reflective Coating Composition 1 g of the light absorbent agent polymer prepared from Example 1 and 0.4 g of the cross-linking agent polymer of formula III were dissolved in a solvent mixture comprising 4 g of propylene glycol methylether acetate solvent; 10 g of methyl 3-methoxy propionate solvent; log of 2-heptanone solvent; and 7 g of tetrahydrofurane solvent. After adding 0.1 g of the thermal acid generator having the structure represented by the formula VII to the resultant material to be dissolved, the dissolved mixture passed through a filter to produce the desired organic anti-reflective coating composition.

[formula III]

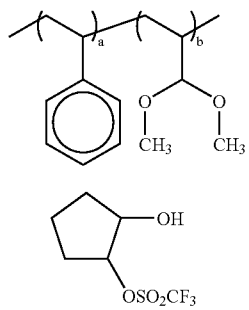

[formula VII]

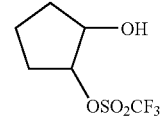

Example 3

Formation of Organic Anti-reflective Coating and Photoresist Pattern

On a silicone wafer, a spin-coating was carried out with the organic anti-reflective coating composition prepared in Example 2, then a baking process was conducted for the obtained material at 215° C. for 2 minutes to generate a cross-linkage bond and form the desirable anti-reflective coating. Thereafter, the obtained anti-reflective coating was put under a coating process with a so-called Keum Ho petroleum photosensitive agent (the name of generally used photoresist materials) and another baking process at 110° C. for 90 seconds. After conducting the above baking process, the baked product was exposed to a light source by means of ASML/900 scanner apparatus then, under an additional baking process at 130° C. for 90 seconds. The exposed wafer was developed using an aqueous solution of 2.38% by weight of TMAH. From the developed material produced was the pattern shown in FIG. 1.

As above mentioned, the present invention provides a polymer of formula I useable as a light absorbent agent for organic anti-reflective coating composition, which can form a cross-linkage bond with a cross-linking polymer containing acetal groups effective in providing solvent-resistance to the final anti-reflective coating and to prevent under-cutting and/or putting phenomena. Furthermore, the polymer of formula I comprises a chromophore having higher absorbance to 193 nm light source, thereby efficiently controlling the interference phenomenon of light at such light source.

Briefly, according to the present invention, it is possible to provide an organic anti-reflective composition comprising the polymer mentioned above and a pattern formation process using the same, whereby an improved perpendicular pattern can be obtained in an ultra-fine pattern formation processes using 193 nm light source, and the present invention can significantly contribute to the high integration of semiconductor device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a pattern on a semiconductor device comprising the steps of:
   (a) coating an organic anti-reflective coating composition on a top portion of a film layer to be etched, wherein the organic anti-reflective coating composition comprises:
   a light absorbent agent polymer represented by the following formula I; a cross-linking polymer represented by the following formula II; a thermal acid generator; and an organic solvent:

[formula I]:

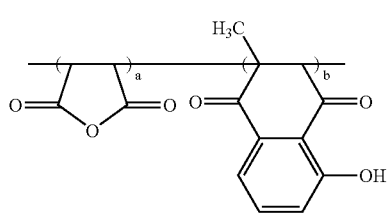

wherein each of a and b represents the mole percent of respective monomers and a:b=5 to 95:5 to 95; and,

[formula II]:

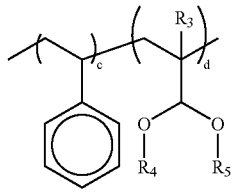

wherein $R_4$ and $R_5$ represent independently alkyl groups having 1 to 10 carbon atoms substituted by a branched chain or a main chain; $R_3$ is a hydrogen or a methyl group; c and d represent the mole percent of respective monomers and c:d=5 to 90:10 to 95;

(b) conducting a baking process for the obtained material to generate cross-linkage bonds and form a resultant organic anti-reflective coating;

(c) applying a photoresist on a top portion of the organic anti-reflective coating, exposing and developing the photoresist to produce a desired photoresist pattern; and (d) etching the organic anti-reflective coating by using the obtained photoresist pattern as an etching mask and, in turn, the film layer to be etched, thereby forming a pattern on the film layer to be etched.

2. The method according to claim 1, comprising performing the baking process at 150° C. to 250° C. for 1 minute to 5 minutes.

3. The method according to claim 1, comprising performing an additional baking process before or after exposing the photoresist in step (c).

4. The method according to claim 3, comprising performing the additional baking process at 70° C. to 200° C.

5. A semiconductor device produced by the pattern formation method of claim 1.

* * * * *